(12) United States Patent
Yonemura et al.

(10) Patent No.: US 12,201,033 B2
(45) Date of Patent: Jan. 14, 2025

(54) MAGNETIC DOMAIN WALL MOVEMENT ELEMENT AND MAGNETIC ARRAY

(71) Applicant: TDK CORPORATION, Tokyo (JP)

(72) Inventors: Shogo Yonemura, Tokyo (JP); Tomoyuki Sasaki, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 356 days.

(21) Appl. No.: 17/543,314

(22) Filed: Dec. 6, 2021

(65) Prior Publication Data

US 2022/0190233 A1 Jun. 16, 2022

(30) Foreign Application Priority Data

Dec. 15, 2020 (JP) ................. 2020-207649

(51) Int. Cl.
*H01L 29/82* (2006.01)
*H01L 27/14* (2006.01)
*H01L 29/66* (2006.01)
*H10B 61/00* (2023.01)
*H10N 50/80* (2023.01)
*H10N 50/85* (2023.01)

(52) U.S. Cl.
CPC ............ *H10N 50/80* (2023.02); *H10B 61/22* (2023.02); *H10N 50/85* (2023.02)

(58) Field of Classification Search
CPC ...... H10N 50/10; H10N 50/85; H10N 70/011; H10N 35/85; H10N 35/00; H10N 70/061; H10N 70/041; H10N 52/85; H10N 70/881; H10N 50/80; H10B 61/22; H10B 61/00; H10B 69/00; H10B 12/30; H10B 61/10; H10B 61/20; H01L 2924/1436
See application file for complete search history.

(56) References Cited

U.S. PATENT DOCUMENTS

2012/0278582 A1 11/2012 Fukami et al.
2016/0276404 A1* 9/2016 Nakamura ......... G11C 19/0841

FOREIGN PATENT DOCUMENTS

| CN | 108780779 A | * 11/2018 | ............ G11C 11/15 |
| JP | 5445970 B2 | 3/2014 | |
| JP | 2020-150113 A | 9/2020 | |
| WO | 2011/052475 A1 | 5/2011 | |

* cited by examiner

*Primary Examiner* — Niki H Nguyen
(74) *Attorney, Agent, or Firm* — Oliff PLC

(57) ABSTRACT

A magnetic domain wall movement element includes: a laminate including a ferromagnetic layer, a non-magnetic layer, and a magnetic domain wall movement layer; a first conductive layer; and a first surface layer laminated above a substrate in order from the substrate, wherein the non-magnetic layer is sandwiched between the ferromagnetic layer and the magnetic domain wall movement layer, wherein the first conductive layer is connected to an upper surface of the magnetic domain wall movement layer, wherein the first surface layer contacts at least a part of an upper surface of the magnetic domain wall movement layer, and wherein the resistivity of the first surface layer is higher than the resistivity of the magnetic domain wall movement layer.

10 Claims, 10 Drawing Sheets

MAGNETIC DOMAIN WALL MOVEMENT ELEMENT AND MAGNETIC ARRAY

BACKGROUND OF THE INVENTION

Field of the Invention

The present invention relates to a magnetic domain wall movement element and a magnetic array.

Priority is claimed on Japanese Patent Application No. 2020-207649, filed Dec. 15, 2020, the content of which is incorporated herein by reference.

Description of Related Art

A next-generation non-volatile memory that replaces a flash memory or the like whose miniaturization has reached its limit is attracting attention. For example, a magnetoresistive random access memory (MRAM), a resistance random access memory (ReRAM), a phase change random access memory (PCRAM) and the like are known as next-generation non-volatile memories.

MRAM uses a change in resistance value caused by a change in magnetization direction for recording data. In order to realize a large capacity of a recording memory, a method of miniaturizing elements constituting the memory and increasing the number of recording bits per element constituting the memory is being studied.

Patent Document 1 describes a magnetic domain wall movement element capable of recording data in multiple values or digital values by moving a magnetic domain in a magnetic domain wall movement layer (first ferromagnetic layer).

PATENT DOCUMENTS

[Patent Document 1] Japanese Patent No. 5445970

SUMMARY OF THE INVENTION

The magnetoresistance of the magnetic domain wall movement element changes depending on the position of the magnetic domain. If the magnetic domain wall movement layer has impurities or defects, the magnetic domain is easily trapped by the impurities or defects. That is, if there are unintended impurities or defects in the magnetic domain wall movement layer, the operation of the magnetic domain in the magnetic domain wall movement element becomes unstable. Even in the magnetic domain wall movement element of Patent Document 1, impurities and defects may be contained in the magnetic domain wall movement layer and the operation of the magnetic domain may become unstable.

The present invention has been made in view of the above-described problems and an object thereof is to provide a magnetic domain wall movement element and a magnetic array capable of stabilizing an operation of a magnetic domain.

(1) A magnetic domain wall movement element according to a first aspect of the present invention includes: a laminate including a ferromagnetic layer, a non-magnetic layer, and a magnetic domain wall movement layer; a first conductive layer; and a first surface layer laminated above a substrate in order from the substrate, the non-magnetic layer is sandwiched between the ferromagnetic layer and the magnetic domain wall movement layer, the first conductive layer is connected to an upper surface of the magnetic domain wall movement layer, the first surface layer contacts at least a part of an upper surface of the magnetic domain wall movement layer, and the resistivity of the first surface layer is higher than the resistivity of the magnetic domain wall movement layer.

(2) The magnetic domain wall movement element according to the above aspect further includes an insulating layer which contact an upper surface of the first surface layer.

(3) In the magnetic domain wall movement element according to the above aspect, the first surface layer may contain amorphous or microcrystals.

(4) In the magnetic domain wall movement element according to the above aspect, the first surface layer may contain at least any one element selected from a group consisting of Bi, Ni, Cr, Ti, Zr, and W.

(5) In the magnetic domain wall movement element according to the above aspect, the thickness of the first surface layer may be 2 nm or less.

(6) In the magnetic domain wall movement element according to the above aspect, an easy magnetization direction of the magnetic domain wall movement layer may intersect a surface where the magnetic domain wall movement layer spreads.

(7) In the magnetic domain wall movement element according to the above aspect, at least a part of the first conductive layer may be sandwiched between the first surface layer and the magnetic domain wall movement layer.

(8) The magnetic domain wall movement element according to the above aspect further includes a second surface layer which contacts an upper surface of the first conductive layer and the resistivity of the second surface layer may be higher than the resistivity of the magnetic domain wall movement layer.

(9) The magnetic domain wall movement element according to the above aspect further includes a third surface layer which contacts a side surface of the first conductive layer and the resistivity of the third surface layer may be higher than the resistivity of the magnetic domain wall movement layer.

(10) A magnetic array according to a second aspect of the present invention includes: a substrate; and a plurality of magnetic domain wall movement elements according to the above aspect and a plurality of the magnetic domain wall movement elements may be integrated on the substrate.

The magnetic domain wall movement element and the magnetic array according to the above aspects can stabilize the operation of the magnetic domain in the magnetic domain wall movement element.

DETAILED DESCRIPTION OF THE INVENTION

Figure 1:
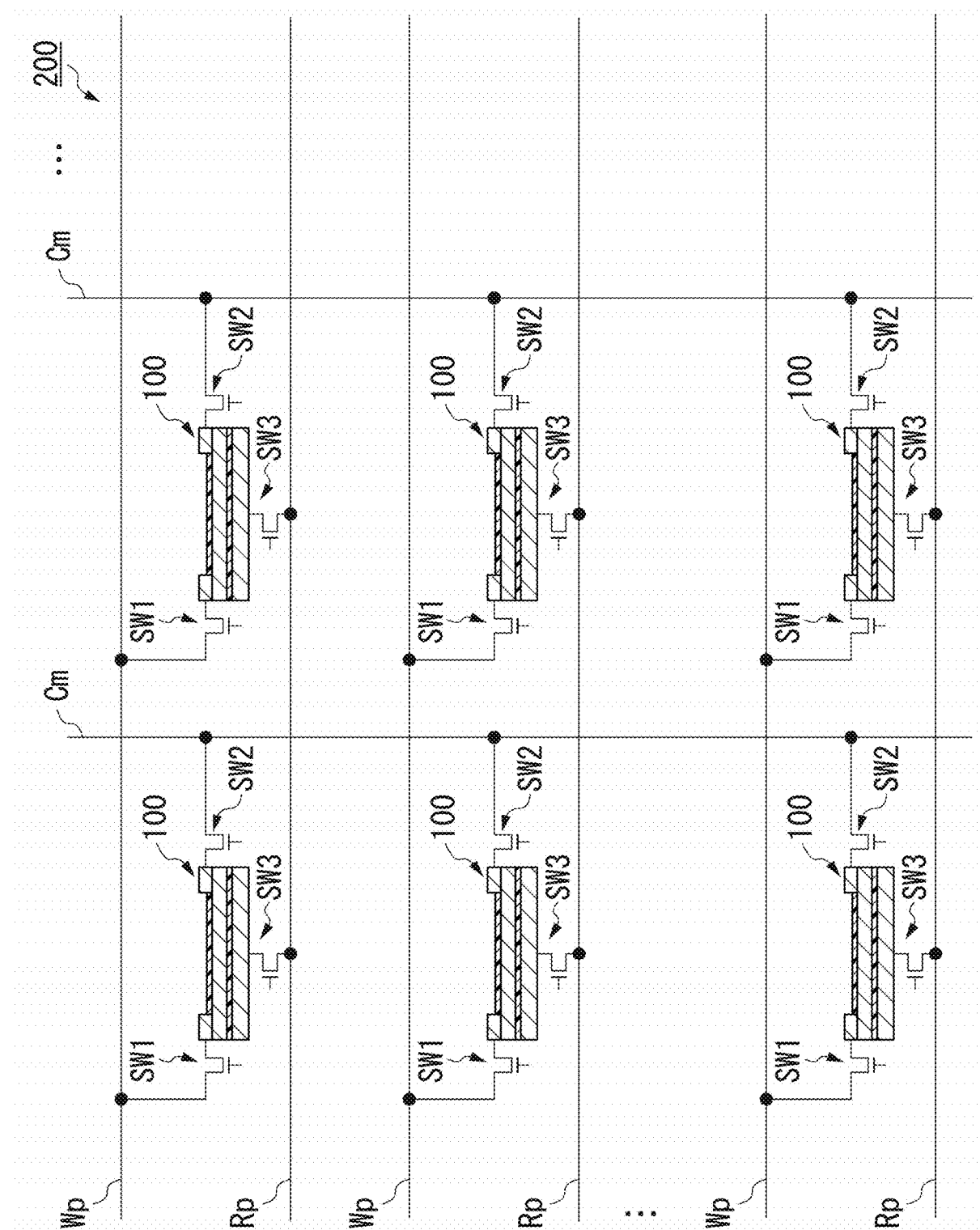
FIG. 1 is a configuration diagram of a magnetic recording array according to a first embodiment.

Hereinafter, this embodiment will be described in detail by appropriately referring to the drawings. In the drawings used in the following description, the featured parts may be enlarged for convenience in order to make the features of this embodiment easy to understand and the dimensional ratios of each component may differ from the actual ones. The materials, dimensions, and the like in the following description are exemplary examples, and the present invention is not limited thereto and can be appropriately modified without changing the gist thereof. Further, although the composition formula described in the specification is described as a stoichiometric composition, a deviation from the stoichiometric composition within a range in which the structure can be maintained is allowed.

First, the direction will be defined. The +x direction, the −x direction, the +y direction, and the −y direction are directions substantially parallel to one surface of the substrate Sub (see FIG. 2) described later. The +x direction is a direction in which a magnetic domain wall movement layer 30 to be described later extends and is a direction directed from a first conductive layer 60 toward a second conductive layer 70 to be described later. The −x direction is a direction opposite to the +x direction. The +x direction and the −x direction are simply referred to as the "x direction" if they are not distinguished from each other. The +y direction is a direction orthogonal to the x direction. The −y direction is a direction opposite to the +y direction. The +y direction and the −y direction are simply referred to as the "y direction" if they are not distinguished from each other. The +z direction is a direction directed from a substrate Sub to be described later toward a magnetic domain wall movement element 100. The −z direction is a direction opposite to the +z direction. The +z direction and the −z direction are simply referred to as the "z direction" if they are not distinguished from each other. Further, in the present specification, "extending in the x direction" means that, for example, the dimension in the x direction is larger than the smallest dimension among the dimensions in the x direction, the y direction, and the z direction. The same applies when extending in other directions.

Next, the terms used in this embodiment will be defined. In the present specification, "connection" means that the subject can have an electrical influence on the object (connection target), and is not limited to a state in which the subject is in direct contact with the object. Further, in the present specification, "contact" means a state in which the subject is in direct contact with the object. Also, "above" means that the subject is on the object and includes both a state in which the subject is on the object and the subject is in contact with the object and a state in which the subject is on the object and the subject is separated from the object.

FIRST EMBODIMENT

FIG. 1 is a configuration diagram of a magnetic array according to a first embodiment. A magnetic array 200 includes a plurality of magnetic domain wall movement elements 100, a plurality of first wirings Wp, a plurality of second wirings Cm, a plurality of third wirings Rp, a plurality of first switching elements SW1, a plurality of second switching elements SW2, and a plurality of third switching elements SW3. The magnetic array 200 can be used, for example, in a magnetic memory, a product sum calculator, a neuromorphic device, a spin memristor, and a magneto-optical element.

<First Wiring, Second Wiring, Third Wiring>

Each of the first wirings Wp is a writing wiring. Each of the first wirings Wp electrically connects a power supply and one or more magnetic domain wall movement elements 100. The power supply is connected to one end portion of the magnetic array 200 in use.

Each of the second wirings Cm is a common wiring. The common wiring is a wiring that can be used both when writing and reading data. Each of the second wirings Cm electrically connects a reference potential and one or more magnetic domain wall movement elements 100. The reference potential is, for example, a ground. The second wiring Cm may be provided in each of the plurality of magnetic domain wall movement elements 100 or may be provided over the plurality of magnetic domain wall movement elements 100.

Each of the third wirings Rp is a reading wiring. Each of the third wirings Rp electrically connects the power supply and one or more magnetic domain wall movement elements 100. The power supply is connected to one end portion of the magnetic array 200 in use.

<First Switching Element, Second Switching Element, and Third Switching Element>

In FIG. 1, the plurality of magnetic domain wall movement elements 100 are respectively connected to the first switching element SW1, the second switching element SW2, and the third switching element SW3. The first switching element SW1 is connected between the magnetic domain wall movement element 100 and the first wiring Wp. The second switching element SW2 is connected between the magnetic domain wall movement element 100 and the second wiring Cm. The third switching element SW3 is connected between the magnetic domain wall movement element 100 and the third wiring Rp.

When the first switching element SW1 and the second switching element SW2 are turned on, a writing current flows between the first wiring Wp and the second wiring Cm connected to the predetermined magnetic domain wall movement element 100. When the second switching element SW2 and the third switching element SW3 are turned on, a reading current flows between the second wiring Cm and the third wiring Rp connected to a predetermined magnetic domain wall movement element 100.

The first switching element SW1, the second switching element SW2, and the third switching element SW3 are elements that control a flow of a current. The first switching element SW1, the second switching element SW2, and the third switching element SW3 are, for example, transistors, elements using a change in phase of a crystal layer such as Ovonic threshold switches (OTS), elements using a change in band structure such as metal insulator transition (MIT) switches, elements using a breakdown voltage such as Zener diodes and avalanche diodes, and elements whose conductivity changes as the atomic position changes.

Any one of the first switching element SW1, the second switching element SW2, and the third switching element SW3 may be shared by the magnetic domain wall movement element 100 connected to the same wiring. For example, when the first switching element SW1 is shared, one first switching element SW1 is provided at the upstream position (one end) of the first wiring Wp. For example, when the second switching element SW2 is shared, one second switching element SW2 is provided at the upstream position (one end) of the second wiring Cm. For example, when the third switching element SW3 is shared, one third switching element SW3 is provided at the upstream position (one end) of the third wiring Rp.

Figure 2:
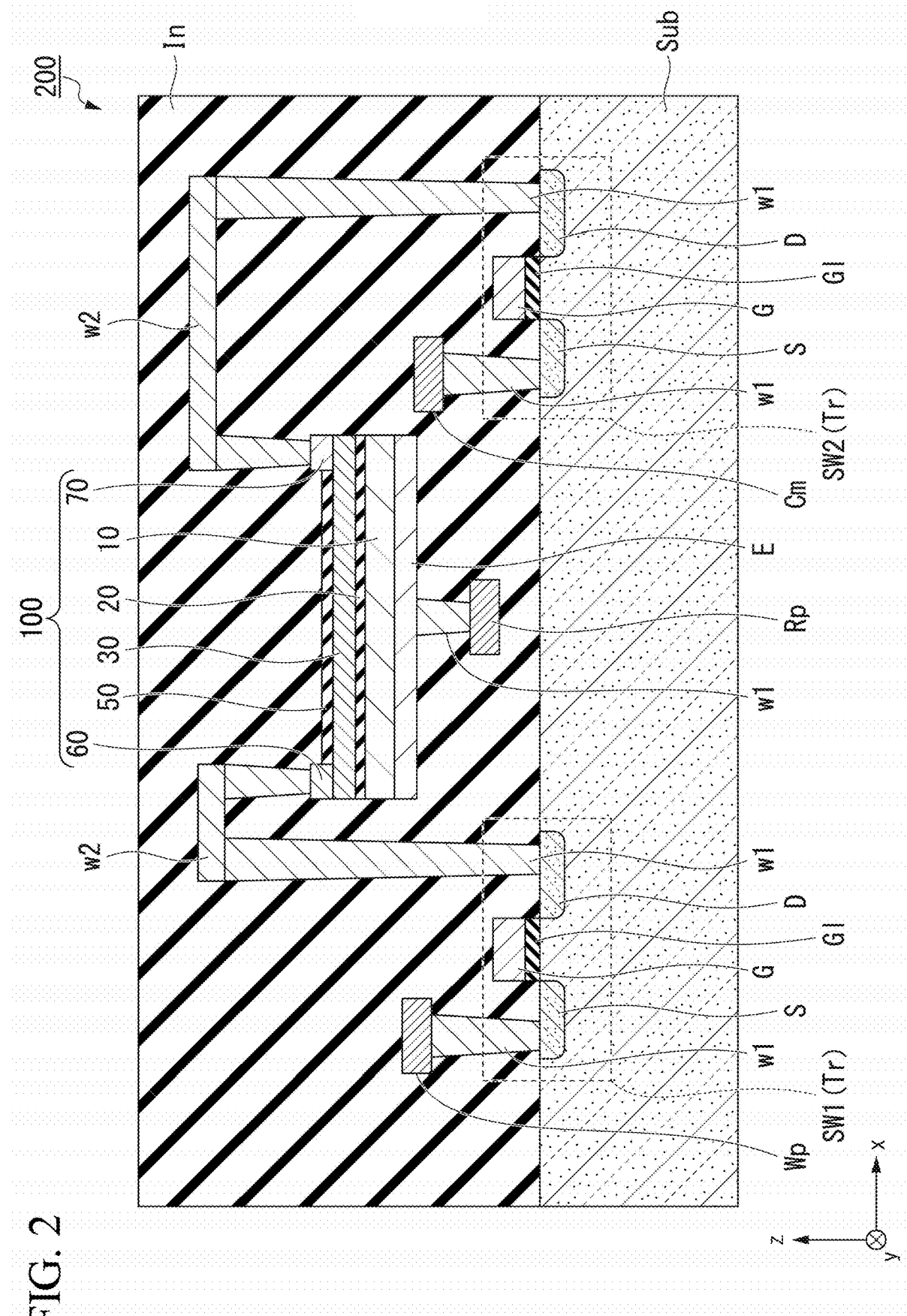
FIG. 2 is a cross-sectional view of a main part of the magnetic recording array according to the first embodiment.

FIG. 2 is a cross-sectional view of a main part of the magnetic array 200 according to the first embodiment. FIG. 2 is a cross-section of one magnetic domain wall movement element 100 in FIG. 1 cut in an xz plane passing through the center of the width in the y direction of the magnetic domain wall movement layer 30.

The first switching element SW1 and the second switching element SW2 shown in FIG. 2 are transistors Tr. The transistor Tr includes a gate electrode G, a gate insulating film GI, and a source region S and a drain region D formed on the substrate Sub. The substrate Sub is, for example, a semiconductor substrate. The third switching element SW3 is electrically connected to the third wiring Rp and is located at a position shifted in the y direction, for example, in FIG. 2.

Each transistor Tr and the magnetic domain wall movement element 100 are electrically connected via wirings w1 and w2. The wirings w1 and w2 contain a conductive material. The wiring w1 is a via wiring extending in the z direction. The wiring w2 is an in-plane wiring extending in any direction in the xy plane. The wirings w1 and w2 are formed in the opening of the insulating layer In.

The insulating layer In is an insulating layer that insulates between the wirings of the multilayer wiring and between the elements. The magnetic domain wall movement element 100 and the transistor Tr are electrically separated by the insulating layer In except for the wirings w1 and w2. The insulating layer In may be, for example, silicon oxide ($SiO_x$), silicon nitride ($SiN_x$), silicon carbide (SiC), chromium nitride, silicon carbide (SiCN), silicon oxynitride (SiON), aluminum oxide ($Al_2O_3$), aluminum nitride (AlON), aluminum nitride (AlN), zirconium oxide ($ZrO_x$), magnesia oxide ($MgO_x$), or the like.

FIG. 2 shows an example in which the magnetic domain wall movement element 100 is located above the substrate Sub with the insulating layer In interposed therebetween, but the magnetic domain wall movement element 100 may be located on the substrate Sub.

[Magnetic Domain Wall Movement Element]

Figure 3:
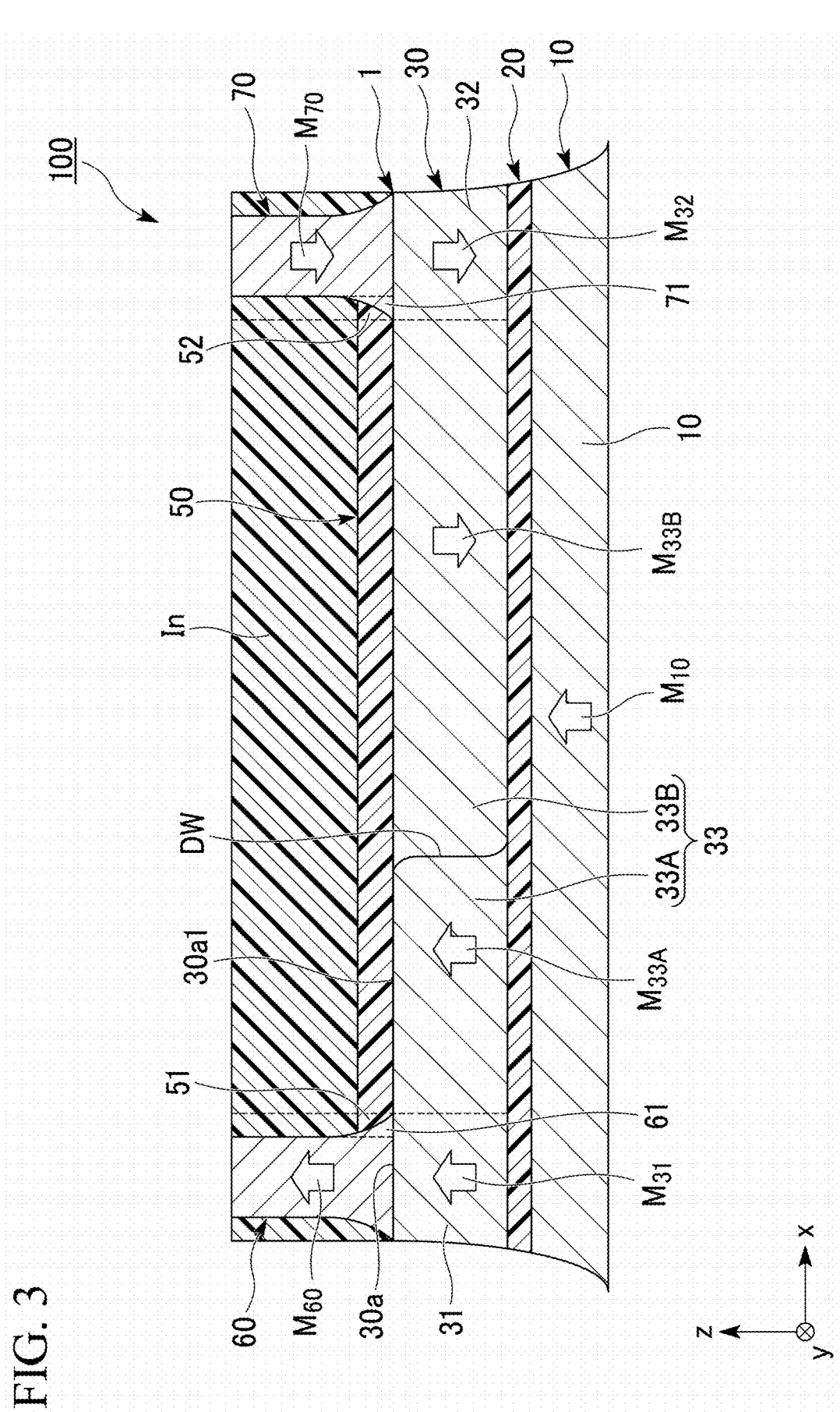
FIG. 3 is a cross-sectional view of a magnetic domain wall movement element according to the first embodiment.

FIG. 3 is a cross-sectional view of the magnetic domain wall movement element 100 according to the first embodiment. The magnetic domain wall movement element 100 includes a laminate 1, a first surface layer 50, a first conductive layer 60, and a second conductive layer 70 laminated above the substrate Sub. The first surface layer 50 is laminated on at least a part of the upper surface of the laminate 1. The first conductive layer 60 and the second conductive layer 70 are laminated on at least a part of the upper surface of the laminate 1. The laminate 1 includes a ferromagnetic layer 10, a non-magnetic layer 20, and a magnetic domain wall movement layer 30. FIG. 3 is a cross-sectional view of the magnetic domain wall movement element 100 cut along the xz plane passing through the center of the magnetic domain wall movement layer 30 in the y direction. An example of the magnetic domain wall movement element 100 is a storage element.

"Ferromagnetic Layer"

The ferromagnetic layer 10 faces the non-magnetic layer 20. The ferromagnetic layer 10 has a magnetization $M_{10}$ oriented in one direction. The magnetization $M_{10}$ of the ferromagnetic layer 10 is less likely to change its orientation direction than the magnetizations $M_{33A}$ and $M_{33B}$ of the magnetic domain wall movement layer 30 when a predetermined external force is applied. The predetermined external force is, for example, an external force applied to the magnetization by an external magnetic field or an external force applied to the magnetization by a spin polarization current. The ferromagnetic layer 10 may be referred to as a magnetization fixed layer and a magnetization reference layer. The magnetization $M_{10}$ is oriented, for example, in the +z direction. In this embodiment, the ferromagnetic layer 10 may be referred to as a first ferromagnetic layer.

Hereinafter, an example in which the magnetization is oriented in the z direction is described, but the magnetizations of the magnetic domain wall movement layer 30 and the ferromagnetic layer 10 may be oriented in any direction in the xy plane. When the magnetization is oriented in the z direction, the power consumption of the magnetic domain wall movement element 100 and the heat generation during operation are suppressed as compared with the case in which the magnetization is oriented in the xy plane. Further, when the magnetization is oriented in the z direction, the movement width of the magnetic domain wall DW becomes smaller when a pulse current of the same intensity is applied than when the magnetization is oriented in the xy plane. On the other hand, when the magnetization is oriented in any of the xy planes, the magnetoresistance change width (MR ratio) of the magnetic domain wall movement element 100 becomes larger than when the magnetization is oriented in the z direction.

The ferromagnetic layer 10 contains a ferromagnet. Examples of the ferromagnetic material forming the ferromagnetic layer 10 include a metal selected from a group consisting of Cr, Mn, Co, Fe, and Ni, an alloy containing one or more of these metals, an alloy containing these metals and at least one or more elements of B, C, and N, and the like. The ferromagnetic layer 10 is, for example, Co—Fe, Co—Fe—B, and Ni—Fe.

The material forming the ferromagnetic layer 10 may be a Heusler alloy. The Heusler alloy is a half metal and has a high spin polarizability. The Heusler alloy is an intermetallic compound having a chemical composition of XYZ or $X_2YZ$, X is a transition metal element or noble metal element of Group Co, Fe, Ni, or Cu on the periodic table, Y is a transition metal of Group Mn, V, Cr, or Ti or an elemental species of X, and Z is a typical element of Groups III to V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

The film thickness of the ferromagnetic layer 10 may be 1.5 nm or less or 1.0 nm or less when the easy magnetization axis of the ferromagnetic layer 10 is in the z direction (perpendicular magnetization film). When the thickness of the ferromagnetic layer 10 is decreased, perpendicular magnetic anisotropy (interface perpendicular magnetic anisotropy) is induced to the ferromagnetic layer 10 at interfaces between the ferromagnetic layer 10 and the other layer (non-magnetic layer 20), so that the magnetization of the ferromagnetic layer 10 is likely to be oriented in the z direction.

When the easy magnetization axis of the ferromagnetic layer 10 is in the z direction (perpendicular magnetization film), the ferromagnetic layer 10 may be a laminate of a ferromagnetic material selected from a group consisting of Co, Fe and Ni and a non-magnetic material selected from a group consisting of Pt, Pd, Ru, and Rh or may be a structure in which an intermediate layer selected from a group consisting of Ir and Ru may be inserted at any position of the laminate. When the ferromagnetic material and the non-magnetic material are laminated, perpendicular magnetic anisotropy can be induced and when the intermediate layer is inserted, the magnetization of the ferromagnetic layer 10 is likely to be oriented in the z direction.

"Magnetic Domain Wall Movement Layer"

The magnetic domain wall movement layer 30 is, for example, a rectangle having a major axis in the x direction and a minor axis in the y direction in a plan view from the z direction. The magnetic domain wall movement layer 30 is a magnetic layer which faces the ferromagnetic layer 10 with the non-magnetic layer 20 interposed therebetween. The magnetic domain wall movement layer 30 is a layer capable of magnetically recording information by changing the internal magnetic state.

The magnetic domain wall movement layer 30 includes magnetization fixing regions 31 and 32 and a magnetic domain wall movement region 33. The magnetic domain wall movement region 33 is sandwiched between two magnetization fixing regions 31 and 32.

The magnetization fixing region 31 is a region overlapping the first conductive layer 60 when viewed from the z direction in the magnetic domain wall movement layer 30. The magnetization fixing region 32 is a region overlapping the second conductive layer 70 when viewed from the z direction in the magnetic domain wall movement layer 30. The magnetizations $M_{31}$ and $M_{32}$ of the magnetization fixing regions 31 and 32 are less likely to be reversed than the magnetizations $M_{33A}$ and $M_{33B}$ of the first magnetic domain 33A and the second magnetic domain 33B of the magnetic domain wall movement region 33 to be described later and are not reversed even when an external force having a threshold value at which the magnetizations $M_{33A}$ and $M_{33B}$ of the magnetic domain wall movement region 33 are reversed is applied. Therefore, it is said that the magnetizations $M_{31}$ and $M_{32}$ of the magnetization fixing regions 31 and 32 are fixed to the magnetizations $M_{33A}$ and $M_{33B}$ of the magnetic domain wall movement region 33.

The magnetization $M_{31}$ of the magnetization fixing region 31 and the magnetization $M_{32}$ of the magnetization fixing region 32 are oriented in different directions. The magnetization $M_{31}$ of the magnetization fixing region 31 and the magnetization $M_{32}$ of the magnetization fixing region 32 are oriented, for example, in opposite directions. The magnetization $M_{31}$ of the magnetization fixing region 31 is oriented, for example, in the +z direction and the magnetization $M_{32}$ of the magnetization fixing region 32 is oriented, for example, in the -z direction.

The magnetic domain wall movement region 33 includes a first magnetic domain 33A and a second magnetic domain 33B. The first magnetic domain 33A is adjacent to the magnetization fixing region 31. The magnetization $M_{33A}$ of the first magnetic domain 33A is influenced by the magnetization $M_{31}$ of the magnetization fixing region 31 and is oriented, for example, in the same direction (parallel to) as the magnetization $M_{31}$ of the magnetization fixing region 31.

The second magnetic domain 33B is adjacent to the magnetization fixing region 32. The magnetization $M_{33B}$ of the second magnetic domain 33B is influenced by the magnetization $M_{32}$ of the magnetization fixing region 32 and is oriented, for example, in the same direction as the magnetization $M_{32}$ of the magnetization fixing region 32. Therefore, the magnetization $M_{33A}$ of the first magnetic domain 33A and the magnetization $M_{33B}$ of the second magnetic domain 33B are oriented in the opposite directions (antiparallel directions).

The boundary between the first magnetic domain 33A and the second magnetic domain 33B is a magnetic domain wall DW. The magnetic domain wall DW moves in the magnetic domain wall movement region 33. In principle, the magnetic domain wall DW does not penetrate into the magnetization fixing regions 31 and 32.

The magnetic domain wall movement element 100 can record data in multiple values or continuously depending on the position of the magnetic domain wall DW of the magnetic domain wall movement layer 30. The data recorded in the magnetic domain wall movement layer 30 is read out as a change in resistance value of the magnetic domain wall movement element 100 when a reading current is applied.

The ratio between the first magnetic domain 33A and the second magnetic domain 33B in the magnetic domain wall movement region 33 changes when the magnetic domain wall DW moves. When the magnetic domain wall DW moves in the +x direction and the area of the first magnetic domain 33A in a plan view from the z direction becomes wide, the resistance value of the magnetic domain wall movement element 100 becomes low. In contrast, when the magnetic domain wall DW moves in the -x direction and the area of the second magnetic domain 33B in a plan view from the z direction becomes wide, the resistance value of the magnetic domain wall movement element 100 becomes high.

The magnetic domain wall DW moves when a writing current flows in the x direction of the magnetic domain wall movement region 33. For example, since electrons flow in the -x direction opposite to the current when a writing current (for example, a current pulse) is applied to the magnetic domain wall movement region 33 in the +x direction, the magnetic domain wall DW moves in the -x direction. When a current flows from the first magnetic domain 33A toward the second magnetic domain 33B, the spin-polarized electrons in the second magnetic domain 33B reverse the magnetization $M_{33A}$ of the first magnetic domain 33A. Since the magnetization $M_{33A}$ of the first magnetic domain 33A is reversed, the magnetic domain wall DW moves in the -x direction.

The magnetic domain wall movement layer 30 is formed of a magnetic material. The magnetic domain wall movement layer 30 preferably has at least one element selected from a group consisting of Co, Ni, Fe, Pt, Pd, Gd, Tb, Mn, Ge, and Ga. Examples of the material used in the magnetic domain wall movement layer 30 include a laminated film of Co and Ni, a laminated film of Co and Pt, a laminated film of Co and Pd, a MnGa-based material, a GdCo-based material, and a TbCo-based material. Ferromagnetic materials such as MnGa-based materials, GdCo-based materials, and TbCo-based materials have a small saturation magnetization, and a threshold current required to move the domain wall DW is small. Further, a laminated film of Co and Ni, a laminated film of Co and Pt, and a laminated film of Co and Pd have a large coercive force, and the moving speed of the magnetic domain wall DW becomes slow.

The easy magnetization direction of the magnetic domain wall movement layer 30 preferably intersects the spreading surface of the magnetic domain wall movement layer 30. That is, the easy magnetization axis of the magnetic domain wall movement layer 30 is preferably in the z direction (perpendicular magnetization film). When the magnetic domain wall movement layer 30 is the perpendicular magnetization film, the magnetic domain wall DW can be driven at a low current.

"Non-Magnetic Layer"

The non-magnetic layer 20 is located between the ferromagnetic layer 10 and the magnetic domain wall movement layer 30. The non-magnetic layer 20 is laminated on one surface of the magnetic domain wall movement layer 30.

The non-magnetic layer 20 is formed of, for example, a non-magnetic insulator, a semiconductor, or a metal. The non-magnetic insulator is, for example, $Al_2O_3$, $SiO_2$, MgO, $MgAl_2O_4$, and a material in which some of these Al, Si, and Mg are replaced with Zn, Be, Ga, and the like. These materials have a large bandgap and excellent insulation. When the non-magnetic layer 20 is formed of the non-magnetic insulator, the non-magnetic layer 20 is a tunnel barrier layer. The non-magnetic metal is, for example, Cu, Au, Ag, and the like. The non-magnetic semiconductor is, for example, Si, Ge, $CuInSe_2$, $CuGaSe_2$, Cu (In, Ga) $Se_2$, and the like.

The thickness of the non-magnetic layer 20 may be, for example, 20 Å or more and 30 Å or more. When the thickness of the non-magnetic layer 20 is thick, the resistance area product (RA) of the magnetic domain wall movement element 100 becomes large. The resistance area product (RA) of the magnetic domain wall movement element 100 may be, for example $1\times10^5$ $\Omega\mu m^2$ or more and $1\times10^6$ $\Omega\mu m^2$ or more. The resistance area product (RA) of the magnetic domain wall movement element 100 is expressed by the product of the element resistance of one magnetic domain wall movement element 100 and the element cross-sectional area of the magnetic domain wall movement element 100 (the area of the cut surface obtained by cutting the non-magnetic layer 20 in the xy plane).

"First Surface Layer"

The first surface layer 50 contacts at least a part of an upper surface 30a of the magnetic domain wall movement layer 30. The first surface layer 50 contacts, for example, at least a part of a first portion 30a1 in the upper surface 30a. Further, the first surface layer 50 may contact the entire first portion 30a1. FIG. 3 shows a state in which the first surface layer contacts the entire first portion. The upper surface 30a is the upper surface of the magnetic domain wall movement layer 30 in the z direction and the first portion 30a1 is a portion located between the first conductive layer 60 and the second conductive layer 70 to be described later in the upper surface 30a.

The first surface layer 50 is sandwiched between the magnetic domain wall movement layer 30 and the insulating layer In, for example, in the z direction.

The first surface layer 50 is adjacent to the first conductive layer 60. The first surface layer 50 is sandwiched between the first conductive layer 60 and the second conductive layer 70, for example, in the x direction.

The resistivity of the first surface layer 50 is higher than the resistivity of the magnetic domain wall movement layer 30. The resistivity of the first surface layer 50 may be, for example, two times or more or three times or more the resistivity of the magnetic domain wall movement layer 30. Further, the resistance value of a first surface layer 50a may be higher than the resistance value of the magnetic domain wall movement layer 30. The resistance value of the first surface layer 50a may be, for example, two times or more or three times or more the resistance value of the magnetic domain wall movement layer 30.

The first surface layer 50 is a layer containing a metal element or an alloy and contains, for example, a metal selected from a group consisting of Bi, Ni, Cr, Ti, Zr, and W, an alloy containing one or more of these metal elements, and the like. The first surface layer 50 may be a layer formed of a metal element or an alloy. By containing these metal elements or alloys, it is possible to further suppress the flow of the current through the first surface layer 50. Further, the current flowing through the magnetic domain wall movement layer 30 can be decreased to a low current, and the magnetic domain wall DW can be driven stably.

As an alloy containing at least one metal element selected from a group consisting of Bi, Ni, Cr, Ti, Zr, and W, for example, manganin, nichrome, and the like are used. As the first surface layer 50, it is preferable to use a metal rather than an alloy from the viewpoint of ease of manufacture. Further, since the resistivity of an alloy varies depending on the composition ratio of a plurality of elements, it is preferable to use a metal rather than an alloy from the viewpoint of ease of controlling the resistivity.

The first surface layer 50 may contain one or more metal elements selected from a group consisting of Pd, Pt, Mg, Ta, and Ru. Further, the first surface layer 50 may be at least partially oxidized or nitrided. That is, the first surface layer 50 may contain an oxide or a nitride in at least a part thereof.

The first surface layer 50 may contain microcrystals or amorphous. The first surface layer 50 may contain microcrystals or amorphous in the inside and may contain microcrystals or amorphous on the surface thereof. The first surface layer 50 may be microcrystals or amorphous. When the first surface layer 50 contains microcrystals or amorphous, crystallization of the first surface layer 50 is suppressed. That is, since the first surface layer 50 contains microcrystals or amorphous, the resistivity of the first surface layer 50 can be increased.

Microcrystals are crystals with a fine particle size. In this embodiment, the microcrystals are those in which a diffraction pattern cannot be obtained by an X-ray diffraction method (XRD), but a diffraction pattern can be obtained by an electron diffraction method (ED). Further, "amorphous" means that a diffraction pattern cannot be obtained by either XRD or ED. In this embodiment, both the microcrystals and the amorphous correspond to an X-ray amorphous in which a diffraction pattern cannot be obtained by XRD and, for example, a continuous and broad peak can be obtained.

Figure 4:
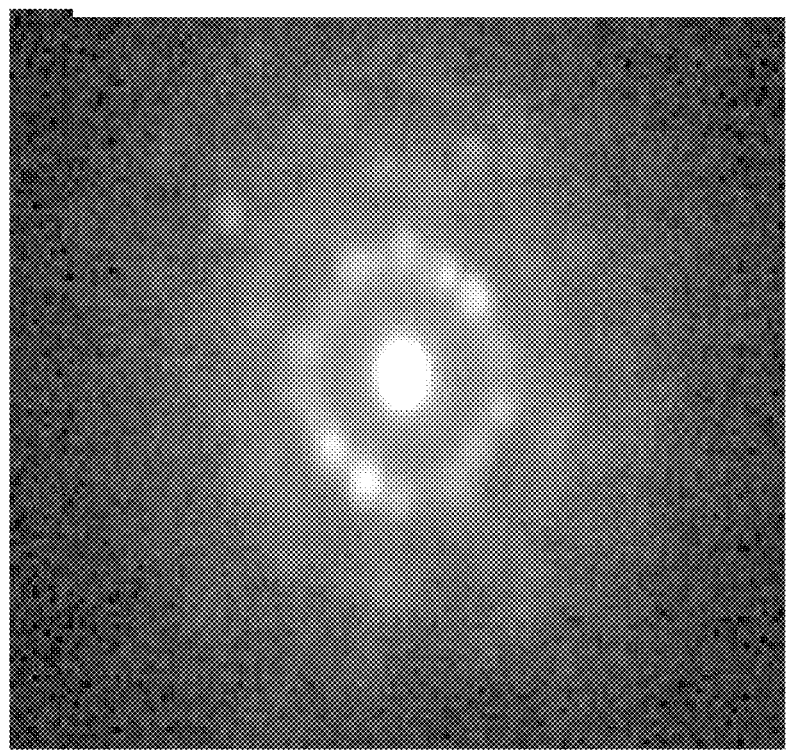
FIG. 4 is a result obtained by performing electron diffraction of microcrystals using a transmission electron microscope (TEM).
Figure 5:
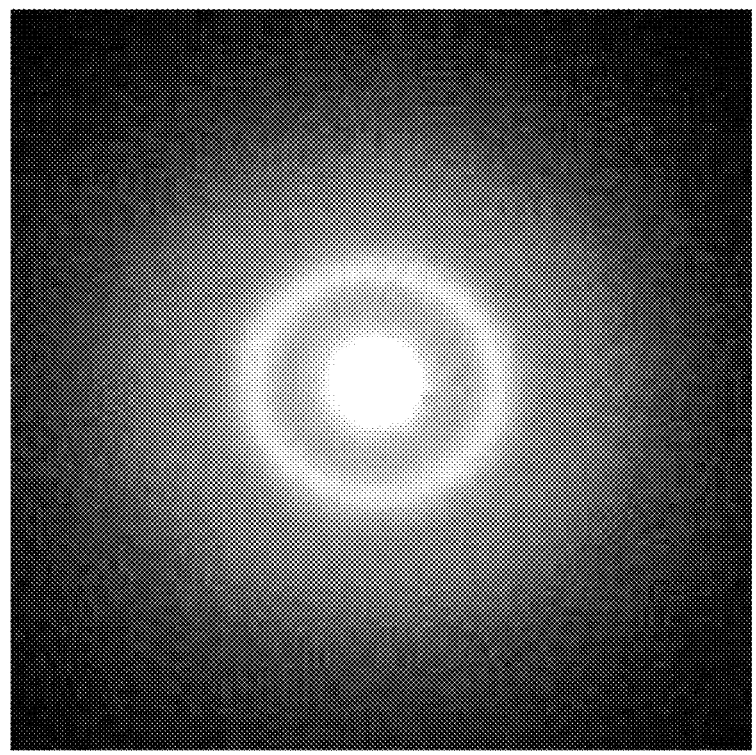
FIG. 5 is a result obtained by performing electron diffraction of amorphous using a transmission electron microscope (TEM).

FIG. 4 is a result obtained by performing electron diffraction of microcrystals using a transmission electron microscope (TEM). Further, FIG. 5 is a result obtained by performing electron diffraction of amorphous using TEM. The white portion shown in FIGS. 4 and 5 is a diffraction spot in which the diffracted light is detected.

The microcrystals have a crystal structure. Therefore, as shown in FIG. 4, the microcrystals can obtain a diffraction spot associated with the crystal structure in electron diffraction. On other hand, the amorphous does not have a specific crystal structure. Therefore, as shown in FIG. 5, the amorphous has an annular halo pattern confirmed in electron diffraction, and no diffraction spot associated with the crystal structure is confirmed. Additionally, in the diffraction spot in which electron diffraction is performed on a single crystal, the diffraction spot due to the crystal structure is confirmed. The diffraction spot of a single crystal is not annular.

When the area of the cross-section perpendicular to the y direction of the first surface layer 50 is decreased, the resistance value of the first surface layer 50 can be increased. For example, the resistance value of the first surface layer 50 can be increased by decreasing the height (thickness) of the first surface layer 50 in the z direction. The thickness of the first surface layer 50 may be, for example, 2 nm or less or 1 nm or less. Further, the first surface layer 50 is likely to contain amorphous or microcrystals by setting the thickness of the first surface layer 50 within the above range.

"First Conductive Layer and Second Conductive Layer"

The first conductive layer 60 and the second conductive layer 70 are connected to at least a part of the upper surface 30a of the magnetic domain wall movement layer 30. The second conductive layer 70 is connected to the magnetic domain wall movement layer 30 while being separated from the first conductive layer 60. The second conductive layer 70 is connected to, for example, the upper surface 30a of the magnetic domain wall movement layer 30. The second conductive layer 70 may be connected to a surface other than the upper surface 30a, such as a side surface of the magnetic domain wall movement layer 30. The first conductive layer 60 and the second conductive layer 70 are connected to, for example, the first end portion and the second end portion of the magnetic domain wall movement layer 30. The first conductive layer 60, the second conductive layer 70, and the magnetic domain wall movement layer 30 may be in direct contact with each other or may interpose other layers therebetween.

At least a part of the first conductive layer 60 is sandwiched between the first surface layer 50 and the magnetic domain wall movement layer 30. In FIG. 3, a sandwiching portion 61 of the first conductive layer 60 is sandwiched between an overlapping portion 51 of the first surface layer 50 and the magnetic domain wall movement layer 30. At least a part of the second conductive layer 70 is sandwiched, for example, between the first surface layer 50 and the magnetic domain wall movement layer 30. In FIG. 3, a sandwiching portion 71 of the second conductive layer 70 is sandwiched between the overlapping portion 52 and the magnetic domain wall movement layer 30. That is, the overlapping portion 51 and the sandwiching portion 61 respectively overlap the overlapping portion 52 and the sandwiching portion 71 in the z direction.

The length of the overlapping portion 51 in the x direction is, for example, shorter than $\frac{1}{10}$ the length of the first conductive layer 60 in the x direction. The length of the overlapping portion 52 in the x direction is, for example, shorter than $\frac{1}{10}$ the length of the second conductive layer 70 in the x direction.

The first conductive layer 60 and the second conductive layer 70 are formed of a conductive material. The first conductive layer 60 and the second conductive layer 70 contain, for example, a magnetic material. The first conductive layer 60 and the second conductive layer 70 contain, for example, a metal selected from a group consisting of Cr, Mn, Co, Fe, and Ni, an alloy containing one or more these metals, an alloy containing these metals and at least one or more elements of B, C, and N, and the like. The first conductive layer 60 and the second conductive layer 70 are, for example, Co—Fe, Co—Fe—B, Ni—Fe, and the like.

Further, when the easy magnetization axis of the first conductive layer 60 and the second conductive layer 70 is in the z direction (perpendicular magnetization film), the first conductive layer 60 and the second conductive layer 70 may be a laminate of a ferromagnetic material selected from a group consisting of Co, Fe, and Ni and a non-magnetic material selected from a group consisting of Pt, Pd, Ru, and Rh. Further, the first conductive layer 60 may have a synthetic antiferromagnetic structure (SAF structure). The synthetic antiferromagnetic structure consists of two magnetic layers sandwiching the non-magnetic layer. The magnetization of each of the two magnetic layers is fixed, and the directions of the fixed magnetization are opposite.

When the first conductive layer 60 contains a magnetic material, the magnetization $M_{60}$ of the first conductive layer 60 is oriented in one direction. The magnetization $M_{60}$ is oriented, for example, in the +z direction. The first conductive layer 60 fixes the magnetization $M_{31}$ of the magnetization fixing region 31. The magnetization $M_{60}$ of the first conductive layer 60 and the magnetization $M_{31}$ of the magnetization fixing region 31 are oriented, for example, in the same direction.

When the second conductive layer 70 contains a magnetic material, the magnetization $M_{70}$ of the second conductive layer 70 is oriented in a direction different from the magnetization $M_{60}$ of the first conductive layer 60. The magnetization $M_{70}$ is oriented, for example, in the −z direction. In this case, the second conductive layer 70 fixes the magnetization $M_{32}$ of the magnetization fixing region 32 and the magnetization $M_{70}$ of the second conductive layer 70 and the magnetization $M_{32}$ of the magnetization fixing region 32 are oriented, for example, in the same direction. When the second conductive layer 70 does not contain a magnetic material, the magnetization $M_{32}$ of the magnetization fixing region 32 is fixed by, for example, an external magnetic field or the like.

Here, an example in which both the first conductive layer 60 and the second conductive layer 70 are magnetic materials is shown. Each of the first conductive layer 60 and the second conductive layer 70 may not be a magnetic material. When the first conductive layer 60 and the second conductive layer 70 are not magnetic materials, the current density of the magnetic domain wall movement layer 30 suddenly decreases at the contact portion with the first conductive layer 60 and the second conductive layer 70, so that the movement range of the magnetic domain wall DW is limited within the magnetic domain wall movement region 33.

When the easy magnetization direction of the first conductive layer 60, the second conductive layer 70, and the magnetic domain wall movement layer 30 is in the z direction (perpendicular magnetization film), the directions of the magnetizations $M_{31}$ and $M_{32}$ of the magnetization fixing regions 31 and 32 can be fixed to the z direction.

The direction of magnetization of each layer of the magnetic domain wall movement element 100 can be confirmed, for example, by measuring the magnetization curve. The magnetization curve can be measured using, for example, a mangeto-optical kern effect (MOKE). The measurement by MOKE is a measurement method performed by directly incident polarized light on an object to be measured and using a magneto-optical effect (magnetic Kerr effect) in which rotation in the polarization direction or the like occurs.

Next, a method of manufacturing the magnetic domain wall movement element 100 will be described. The magnetic domain wall movement element 100 is formed by a laminating step of each layer and a processing step of processing a part of each layer into a predetermined shape. For the lamination of each layer, a sputtering method, a chemical vapor deposition (CVD) method, an electron beam vapor deposition method (EB vapor deposition method), an atomic laser deposit method, or the like can be used. Processing of each layer can be performed using photolithography, ion milling, or the like.

First, the ferromagnetic layer, the non-magnetic layer, the magnetic domain wall movement layer, and the conductive layer are sequentially laminated above the substrate Sub. Next, for example, when the unnecessary portion in the x direction and the y direction of these layers are removed by photolithography, each layer is processed into a predetermined shape so that the ferromagnetic layer becomes the ferromagnetic layer 10, the non-magnetic layer becomes the non-magnetic layer 20, and the magnetic domain wall movement layer becomes the magnetic domain wall movement layer 30. Next, a portion excluding two portions overlapping the end portion of the magnetic domain wall movement layer 30 in the conductive layer is removed by, for example, ion milling That is, a portion corresponding to the first portion 30a1 in the upper surface 30a of the magnetic domain wall movement layer 30 is exposed. By this process, the conductive layer becomes the first conductive layer 60 and the second conductive layer 70. Next, the first surface layer 50 is laminated on the first portion 30a1. Then, the upper surfaces of the first surface layer, the first conductive layer 60, and the second conductive layer 70 may be covered with the insulating layer In. That is, the magnetic domain wall movement element 100 may include the insulating layer In which contacts the upper surface of the first surface layer 50. In this way, the magnetic domain wall movement element 100 shown in FIG. 3 can be obtained. The magnetic array 200 shown in FIGS. 1 and 2 is manufactured by using a method of manufacturing the magnetic domain wall movement element 100 according to this embodiment and a method of manufacturing a known magnetic array.

According to the magnetic domain wall movement element 100 of the first embodiment, it is possible to stabilize the operation of the magnetic domain wall DW. The operation of the magnetic domain wall DW is, for example, the controllability of the magnetic domain wall DW such as the ease of movement of the magnetic domain wall DW. When the controllability of the magnetic domain wall DW is improved, malfunctions such as erroneous writing can be prevented, and the reliability of the magnetic domain wall movement element 100 is improved. The reason why the magnetic domain wall movement element 100 according to this embodiment can obtain the above-described effect will be described by using a comparative example.

Figure 6:
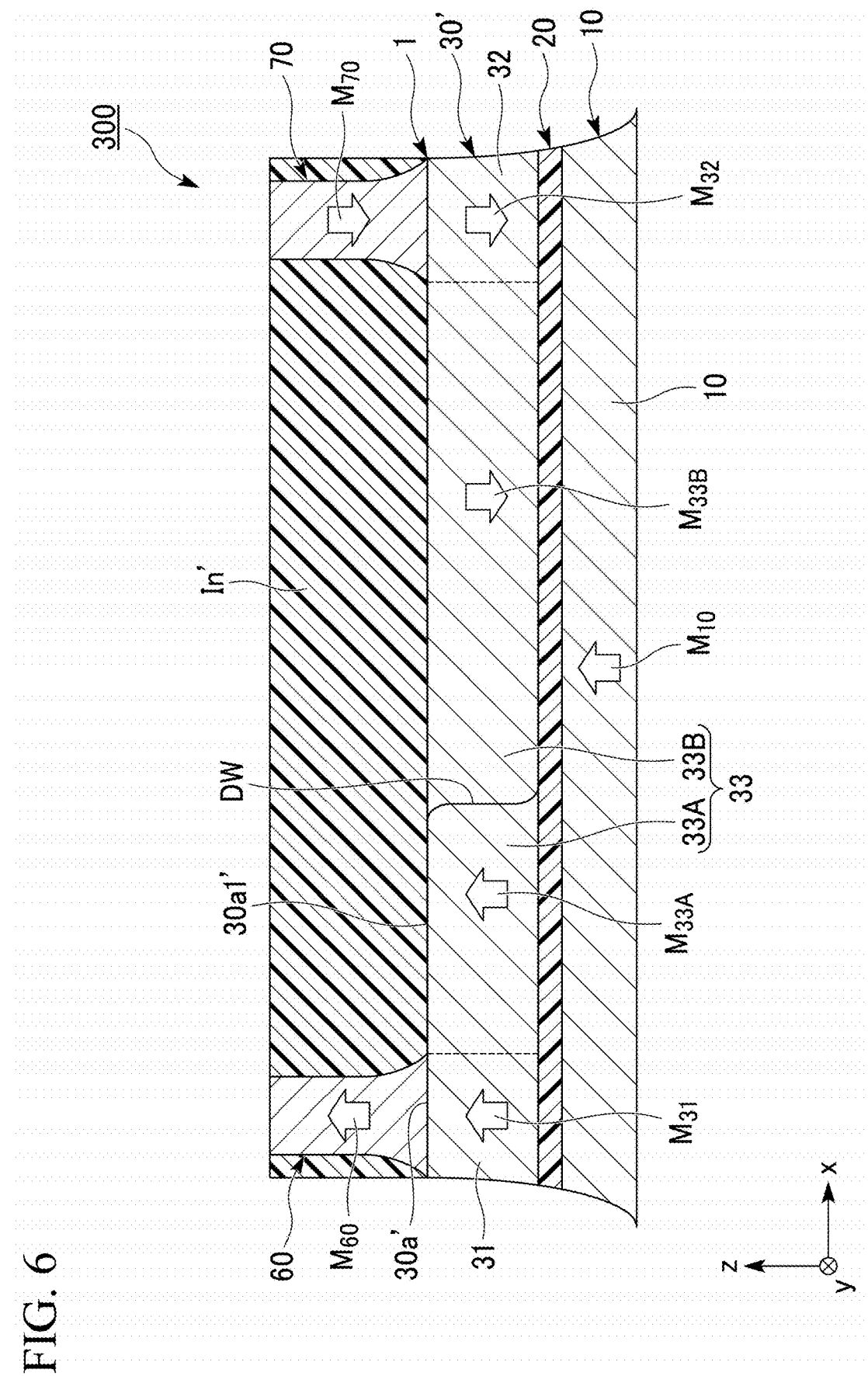
FIG. 6 is a cross-sectional view of a magnetic domain wall movement element according to a comparative example.

FIG. 6 is a cross-sectional view of a magnetic domain wall movement element 300 according to a comparative example. The magnetic domain wall movement element 300 according to the comparative example is a bottom pin type magnetic domain wall movement element. The magnetic domain wall movement element 300 according to the comparative example is different from the magnetic domain wall movement element 100 according to the first embodiment in that the first surface layer 50 is not provided and an insulating layer In' contacts a first portion 30a1'. In the magnetic domain wall movement element 300, the same constituent elements as those of the magnetic domain wall movement element 100 are designated by the same reference numerals, and a description thereof will be omitted.

In the magnetic domain wall movement element 300, the insulating layer In' is formed after forming the magnetic domain wall movement layer 30' in the manufacturing process. Since silicon oxide ($SiO_x$), silicon nitride ($SiN_x$), silicon carbide (SiC), chromium nitride, silicon carbide (SiCN), silicon oxynitride (SiON), aluminum oxide ($Al_2O_3$), zirconium oxide ($ZrO_x$), magnesia oxide ($MgO_x$) and the like are used as the insulating layer In', an upper surface 30a' of the magnetic domain wall movement layer 30' may be oxidized or nitrided in the step of forming the insulating layer In'. Further, in the step of forming the insulating layer In', a defect may occur on the upper surface 30a' of the magnetic domain wall movement layer 30'. That is, the first portion 30a1' of the upper surface 30a' may contain impurities such as oxides and nitrides and defects.

The impurities and defects in the magnetic domain wall movement layer 30' are the trapping factors of the magnetic domain wall DW. When the trapping factors exist in the magnetic domain wall movement layer 30', the magnetic domain wall DW may be strongly trapped in the vicinity of the trapping factors. When the magnetic domain wall DW is strongly trapped, the magnetic domain wall DW is not smoothly operated even when a current having a predetermined current density is applied to the magnetic domain wall movement layer 30'. That is, the magnetic domain wall movement element 300 requires sufficient energy to move the magnetic domain wall DW even when the magnetic domain wall DW is trapped due to a defect or the like and is not operated stably unless a current equal to or larger than the inversion current density is applied.

In contrast, in the magnetic domain wall movement element 100 according to the first embodiment, at least a part of the upper surface 30a of the magnetic domain wall movement layer 30 contacts the first surface layer 50. Therefore, in the magnetic domain wall movement element 100, the insulating layer In is formed after forming the first surface layer 50. Thus, in the manufacturing process of the magnetic domain wall movement element 100, the generation of impurities such as oxides and nitrides and defects on the upper surface 30a is suppressed. Thus, in the magnetic domain wall movement element 100 according to the first embodiment, it is possible to suppress the formation of a trap factor in the magnetic domain wall movement layer 30.

Thus, in the magnetic domain wall movement element 100 according to the first embodiment, it is possible to stabilize the operation of the magnetic domain wall DW.

Further, in the magnetic domain wall movement element 100 according to the first embodiment, since the magnetic domain wall movement layer, the first conductive layer, and the second conductive layer can be laminated together, the magnetic bond between the magnetic domain wall movement layer 30, the first conductive layer 60, and the second conductive layer 70 is stabilized. Further, in the magnetic domain wall movement element 100 according to the first embodiment, it is possible to suppress the sandwiching portions 61 and 71 from being oxidized or nitrided by the insulating layer In.

The resistivity of the first surface layer 50 is higher than the resistivity of the magnetic domain wall movement layer 30. Therefore, in the magnetic domain wall movement element 100, it is possible to suppress the current from flowing to the first surface layer 50 when the writing current is applied in the x direction of the magnetic domain wall movement layer 30.

[First Modified Example]

Figure 7:
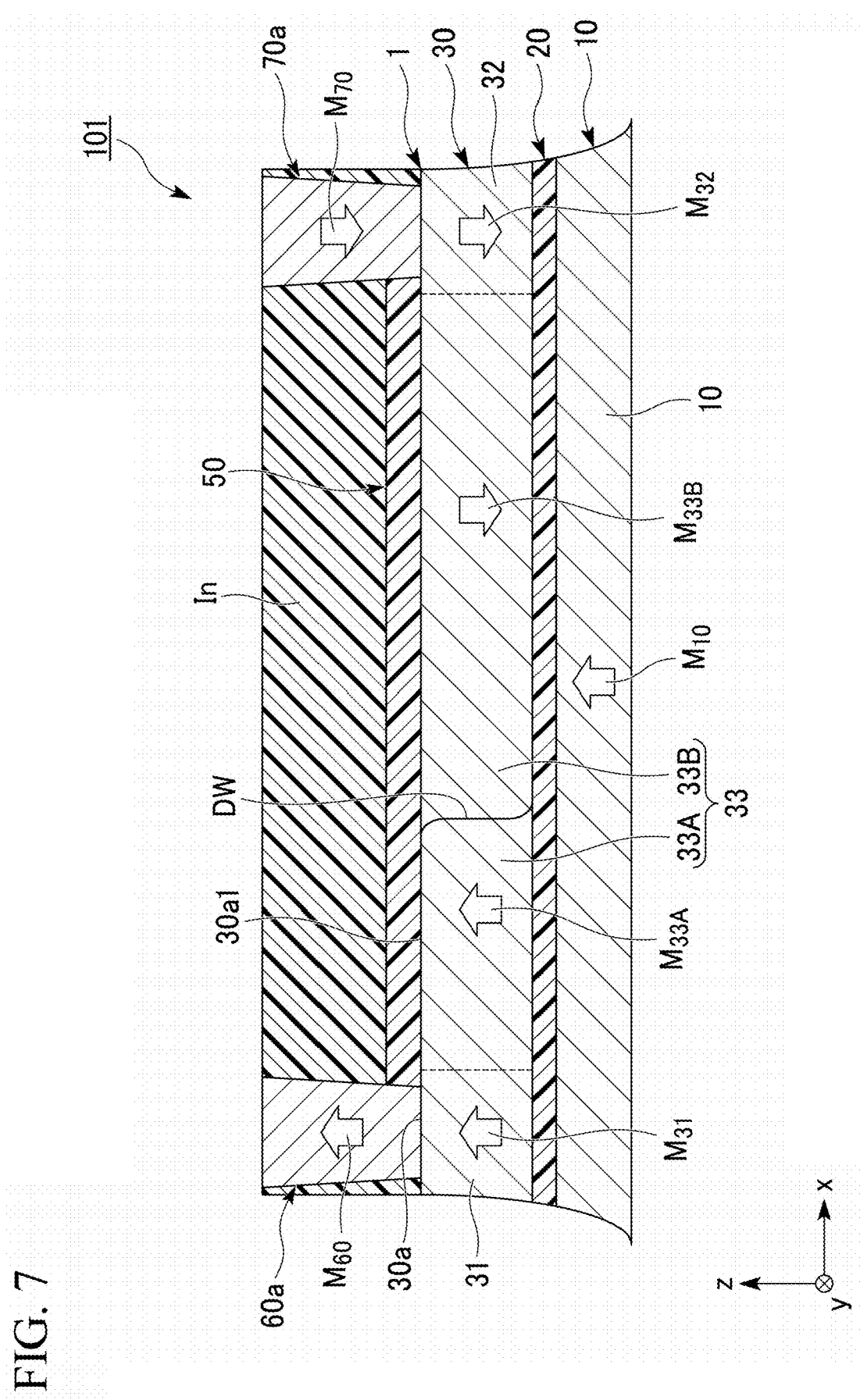
FIG. 7 is a cross-sectional view of a magnetic domain wall movement element according to a first modified example.

FIG. 7 is a cross-sectional view of a magnetic domain wall movement element 101 according to a first modified example. The magnetic domain wall movement element 101 is different from the magnetic domain wall movement element 100 according to the first embodiment in the shapes of a first surface layer 50a, a first conductive layer 60a, and a second conductive layer 70a. In the magnetic domain wall movement element 101, the same constituent elements as those of the magnetic domain wall movement element 100 are designated by the same reference numerals, and a description thereof will be omitted.

In the magnetic domain wall movement element 101 shown in FIG. 7, at least a part of the first surface layer 50*a* is sandwiched between the first conductive layer 60*a* and the magnetic domain wall movement layer 30. Further, at least a part of the first surface layer 50*a* is sandwiched between the second conductive layer 70*a* and the magnetic domain wall movement layer 30.

In order to manufacture the magnetic domain wall movement element 101, for example, the ferromagnetic layer, the non-magnetic layer, the magnetic domain wall movement layer, and the surface layer are first sequentially laminated on the substrate Sub and the insulating layer In. Then, photolithography removes unnecessary portions in the x direction and the y direction of these layers. Next, two portions of the surface layer overlapping the end portion of the magnetic domain wall movement layer 30 are removed by, for example, ion milling. That is, a portion corresponding to the end portion in the upper surface 30*a* of the magnetic domain wall movement layer 30 is exposed. According to this process, the surface layer becomes the first surface layer 50*a*. Next, the end portion of the exposed magnetic domain wall movement layer 30 is filled with a conductor to form the first conductive layer 60*a* and the second conductive layer 70*a*. Next, the first surface layer 50*a*, the first conductive layer 60*a*, and the second conductive layer 70*a* may be covered with the insulating layer In. The difference in shape between the first conductive layer 60 and the second conductive layer 70 of the magnetic domain wall movement element 100 and the first conductive layer 60*a* and the second conductive layer 70*a* of the magnetic domain wall movement layer 101 is due to the difference in the order of the manufacturing processes.

Even in the magnetic domain wall movement element 101 according to the first modified example, it is possible to obtain the same effect as that of the magnetic domain wall movement element 100 according to the first embodiment. Particularly, in the magnetic domain wall movement element 101, since the first surface layer 50*a* is formed before the first conductive layer 60*a* and the second conductive layer 70*a*, it is possible to suppress the first portion 30*a*1 in the upper surface 30*a* of the magnetic domain wall movement layer 30 from becoming rough due to ion milling. Therefore, in the first modified example, it is possible to smoothen the surface of the upper surface 30*a* of the magnetic domain wall movement layer 30. Thus, it is possible to further stabilize the operation of the magnetic domain wall DW.

Further, in the magnetic domain wall movement element 101, after laminating the surface layer, the portions corresponding to the first conductive layer 60*a* and the second conductive layer 70*a* in the surface layer are removed by ion milling or the like and the first conductive layer 60*a* and the second conductive layer 70*a* are formed. Therefore, the surface contacting the first conductive layer 60*a* and the surface contacting the second conductive layer 70*a* in the magnetic domain wall movement layer 30*a* become rougher than that of the first portion 30*a*1. When the surface contacting the first conductive layer 60*a* and the surface contacting the second conductive layer 70*a* in the magnetic domain wall movement layer 30*a* become rough, it is easy to fix the magnetic domain wall DW in the magnetization fixing regions 31 and 32. That is, it is possible to further suppress the magnetic domain wall DW from invading the magnetization fixing regions 31 and 32.

Additionally, FIG. 7 shows an example in which at least a part of the first conductive layer 60*a* and the first surface layer 50*a* and at least a part of the second conductive layer 70*a* and the first surface layer 50*a* overlap each other in the z direction, but the present invention is not limited to this example. For example, the first surface layer 50*a* may not overlap the first conductive layer 60*a* and the second conductive layer 70*a* in the z direction.

[Second Modified Example]

Figure 8:
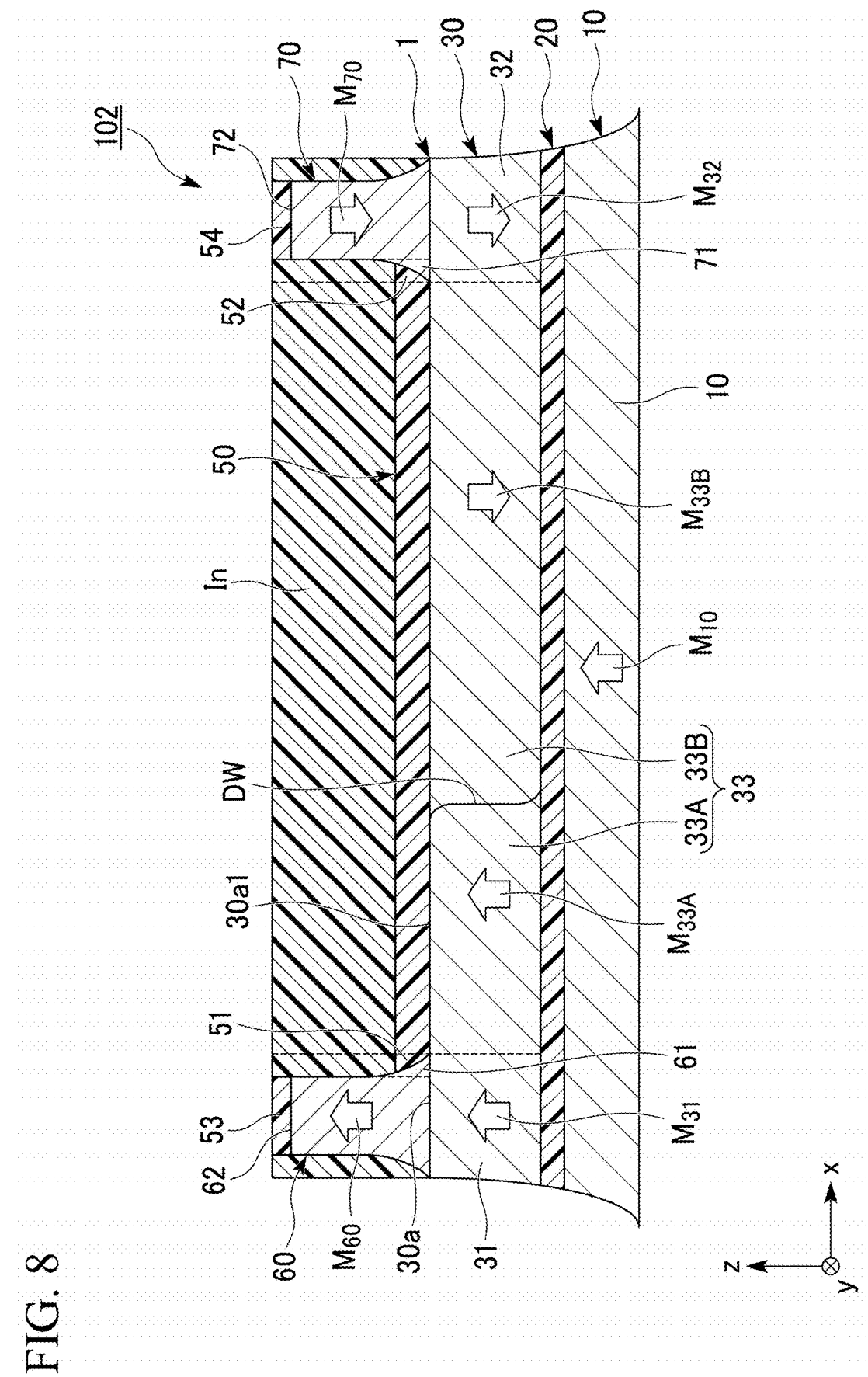
FIG. 8 is a cross-sectional view of a magnetic domain wall movement element according to a second modified example.

FIG. 8 is a cross-sectional view of a magnetic domain wall movement element 102 according to a second modified example. The magnetic domain wall movement element 102 is different from the magnetic domain wall movement element 100 according to the first embodiment in that second surface layers 53 and 54 are provided. The second surface layers 53 and 54 contact an upper surface 62 of the first conductive layer 60 and an upper surface 72 of the second conductive layer 70. In the magnetic domain wall movement element 102, the same constituent elements as those of the magnetic domain wall movement element 100 are designated by the same reference numerals, and a description thereof will be omitted.

The same material as that of the first surface layer 50 can be used for the second surface layers 53 and 54. The resistivity of the second surface layers 53 and 54 is higher than, for example, the resistivity of the magnetic domain wall movement layer 30. The resistivity of the second surface layers 53 and 54 may be two times or more or three times or more the resistivity of the magnetic domain wall movement layer 30. Further, the second surface layers 53 and 54 may be respectively formed on at least a part of the upper surfaces 62 and 72 or the entire upper surfaces 62 and 72.

For example, the magnetic domain wall movement element 102 is manufactured by forming a hole at a position overlapping the first conductive layer 60 or the second conductive layer 70 in the insulating layer In after forming the magnetic domain wall movement element 101 and filling the hole similarly to the first surface layer 50*a*. Further, the hole may be covered with the insulating layer In after laminating the second surface layers 53 and 54.

Even in the magnetic domain wall movement element 102 according to the second modified example, it is possible to obtain the same effect as that of the magnetic domain wall movement element 100 according to the first embodiment. Further, in the magnetic domain wall movement element 102, it is possible to suppress the upper surfaces 62 and 72 of the first conductive layer 60 and the second conductive layer 70 from being oxidized or nitrided. Thus, it is possible to strongly fix the magnetizations $M_{31}$ and $M_{32}$ of the magnetization fixing regions 31 and 32 by the first conductive layer 60 and the second conductive layer 70. That is, it is possible to further suppress the magnetic domain wall DW from invading the magnetization fixing regions 31 and 32.

[Third Modified Example]

Figure 9:
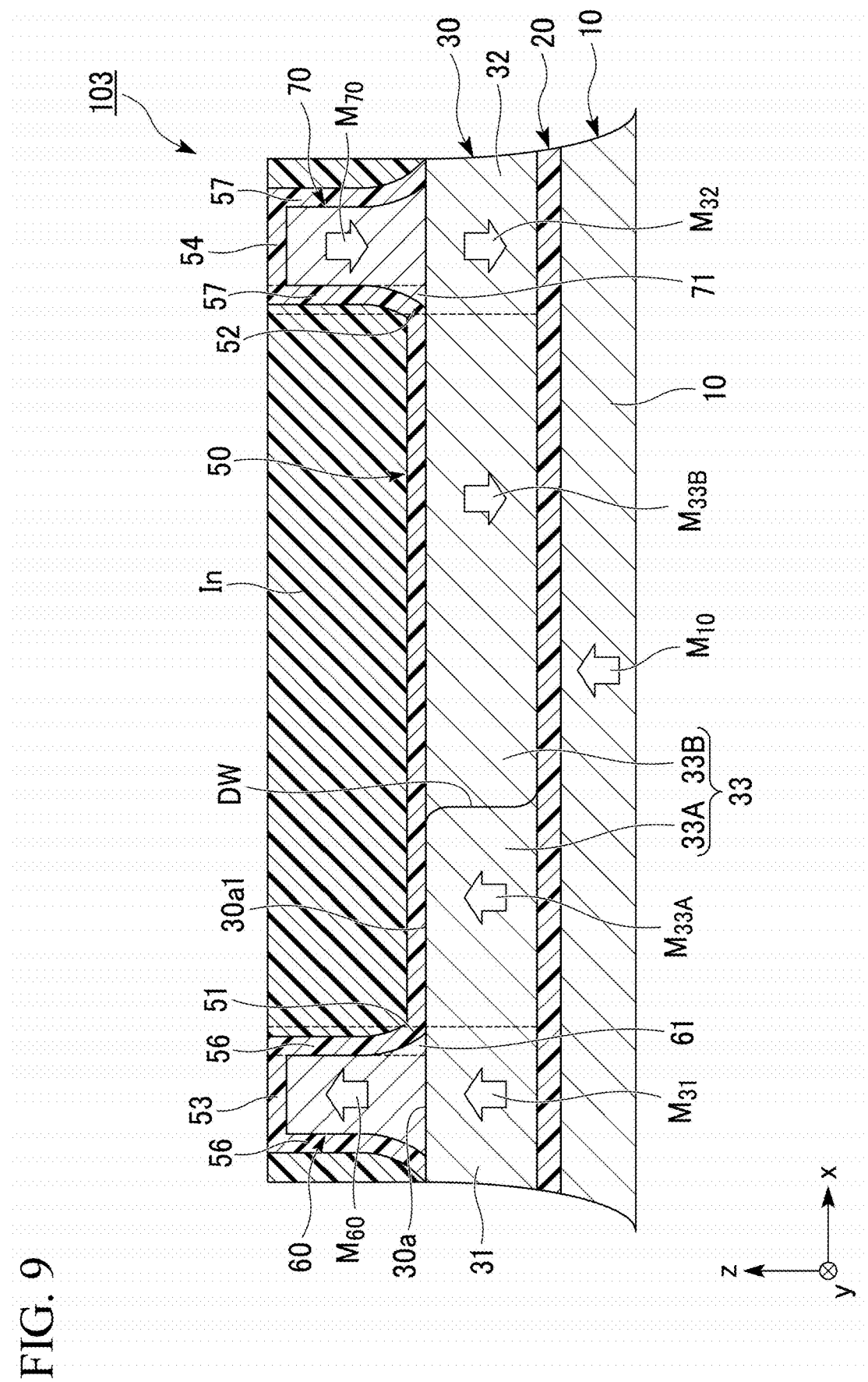
FIG. 9 is a cross-sectional view of a magnetic domain wall movement element according to a third modified example.

FIG. 9 is a cross-sectional view of a magnetic domain wall movement element 103 according to a third modified example. The magnetic domain wall movement element 103 is different from the magnetic domain wall movement element 102 in that third surface layers 56 and 57 contacting the side surfaces of the first conductive layer 60 and the second conductive layer 70 are provided. In the magnetic domain wall movement element 103, the same constituent elements as those of the magnetic domain wall movement element 102 are designated by the same reference numerals, and a description thereof will be omitted. FIG. 9 shows an example in which the third surface layers 56 and 57 are formed on both side surfaces of the first conductive layer 60 and the second conductive layer 70, but the third surface layers 56 and 57 may be formed on at least one side surface of the first conductive layer 60 and the second conductive layer 70. Additionally, FIG. 9 shows an example in which the first surface layer 50, the second surface layers 53 and 54, and the third surface layers 56 and 57 are integrated with each other, but these layers may be separated to be independent from each other.

The same material as that of the first surface layer 50 can be used for the third surface layers 56 and 57. The resistivity of the third surface layers 56 and 57 is higher than the resistivity of the magnetic domain wall movement layer 30. The resistivity of the third surface layers 56 and 57 may be two times or more or three times or more the resistivity of the magnetic domain wall movement layer 30. The third surface layers 56 and 57 may be respectively formed on both side surfaces of the first conductive layer 60 and the second conductive layer 70 in the x direction or may be formed one side surface.

The magnetic domain wall movement element 103 according to the third modified example is manufactured by, for example, the same method as that of the magnetic domain wall movement element 100 according to the first embodiment. That is, the magnetic domain wall movement element 103 is manufactured by forming a surface layer on the first conductive layer 60, the second conductive layer 70, and the first portion 30a1 of the magnetic domain wall movement layer 30 after forming the first conductive layer 60 and the second conductive layer 70 and covering the surface layer with the insulating layer In.

Even in the magnetic domain wall movement element 103 according to the third modified example, it is possible to obtain the same effect as that of the magnetic domain wall movement element 100 according to the first embodiment. Further, in the magnetic domain wall movement element 103, it is possible to suppress the side surfaces of the first conductive layer 60 and the second conductive layer 70 from being oxidized or nitrided by the insulating layer In. Thus, it is possible to strongly fix the magnetizations $M_{31}$ and $M_{32}$ of the magnetization fixing regions 31 and 32 by the first conductive layer 60 and the second conductive layer 70. That is, it is possible to further suppress the magnetic domain wall DW from invading the magnetization fixing regions 31 and 32.

[Fourth Modified Example]

Figure 10:
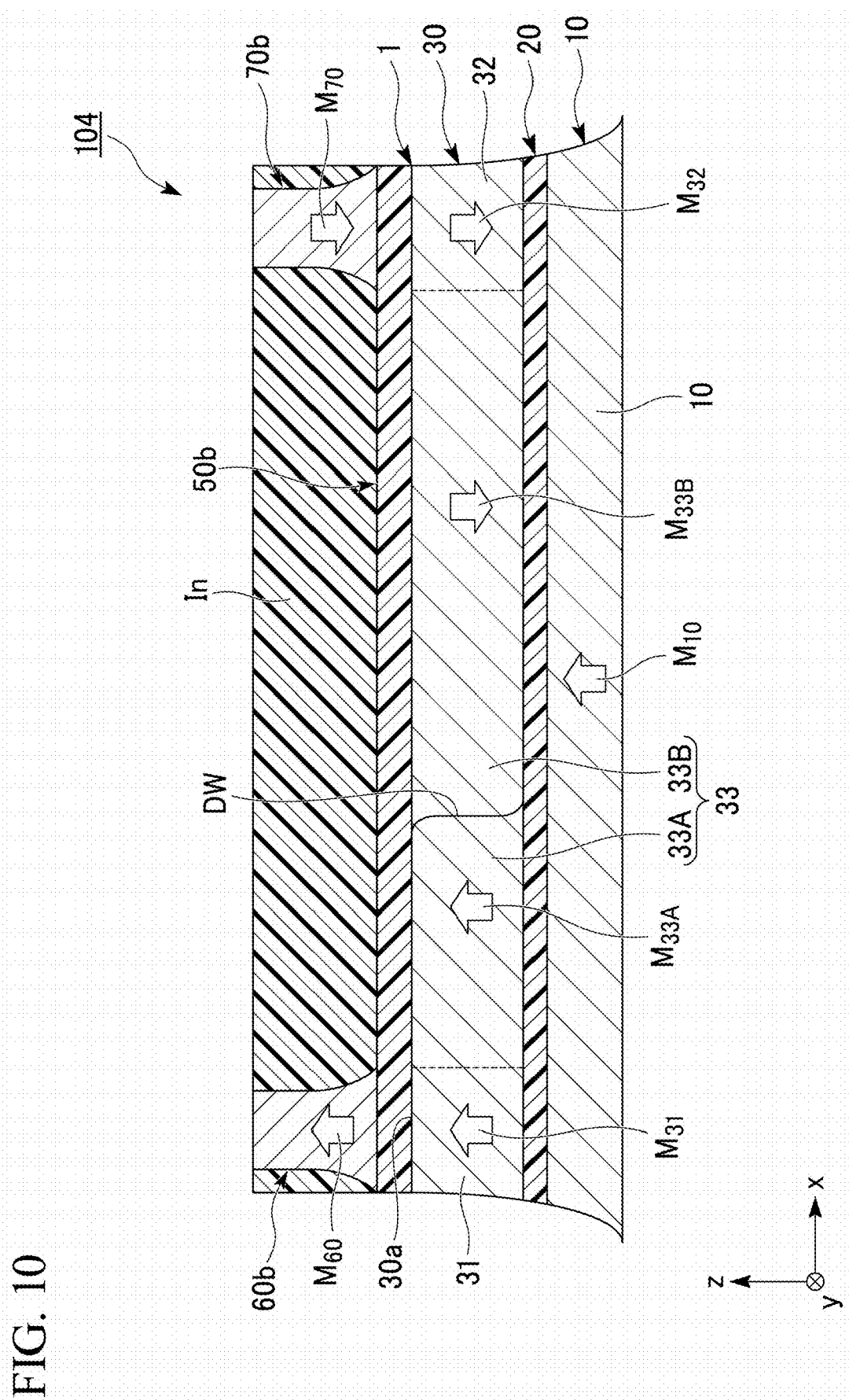
FIG. 10 is a cross-sectional view of a magnetic domain wall movement element according to a fourth modified example.

FIG. 10 is a cross-sectional view of a magnetic domain wall movement element 104 according to a fourth modified example. The magnetic domain wall movement element 104 is different from the magnetic domain wall movement element 100 in that at least a part of the first surface layer 50b is sandwiched between the first and second conductive layers 60b and 70b and the magnetic domain wall movement layer 30. In the magnetic domain wall movement element 104, the same constituent elements as those of the magnetic domain wall movement element 100 are designated by the same reference numerals, and a description thereof will be omitted.

The first surface layer 50b may be formed over the entire region overlapping the first conductive layer 60b and the second conductive layer 70b in a plan view from the z direction or may be formed to include a part of the region overlapping the first conductive layer 60b and the second conductive layer 70b.

The same material as that of the first surface layer 50 can be used for the first surface layer 50b. Each of the first conductive layer 60b and the second conductive layer 70b is connected to the magnetic domain wall movement layer 30.

The thickness of the first conductive layer 60b and the second conductive layer 70b in the z direction is smaller than the thickness of the first conductive layer 60 and the second conductive layer 70.

Even in the magnetic domain wall movement element 104 according to the fourth modified example, it is possible to obtain the same effect as that of the magnetic domain wall movement element 100 according to the first embodiment.

[Fifth Modified Example]

Figure 11:
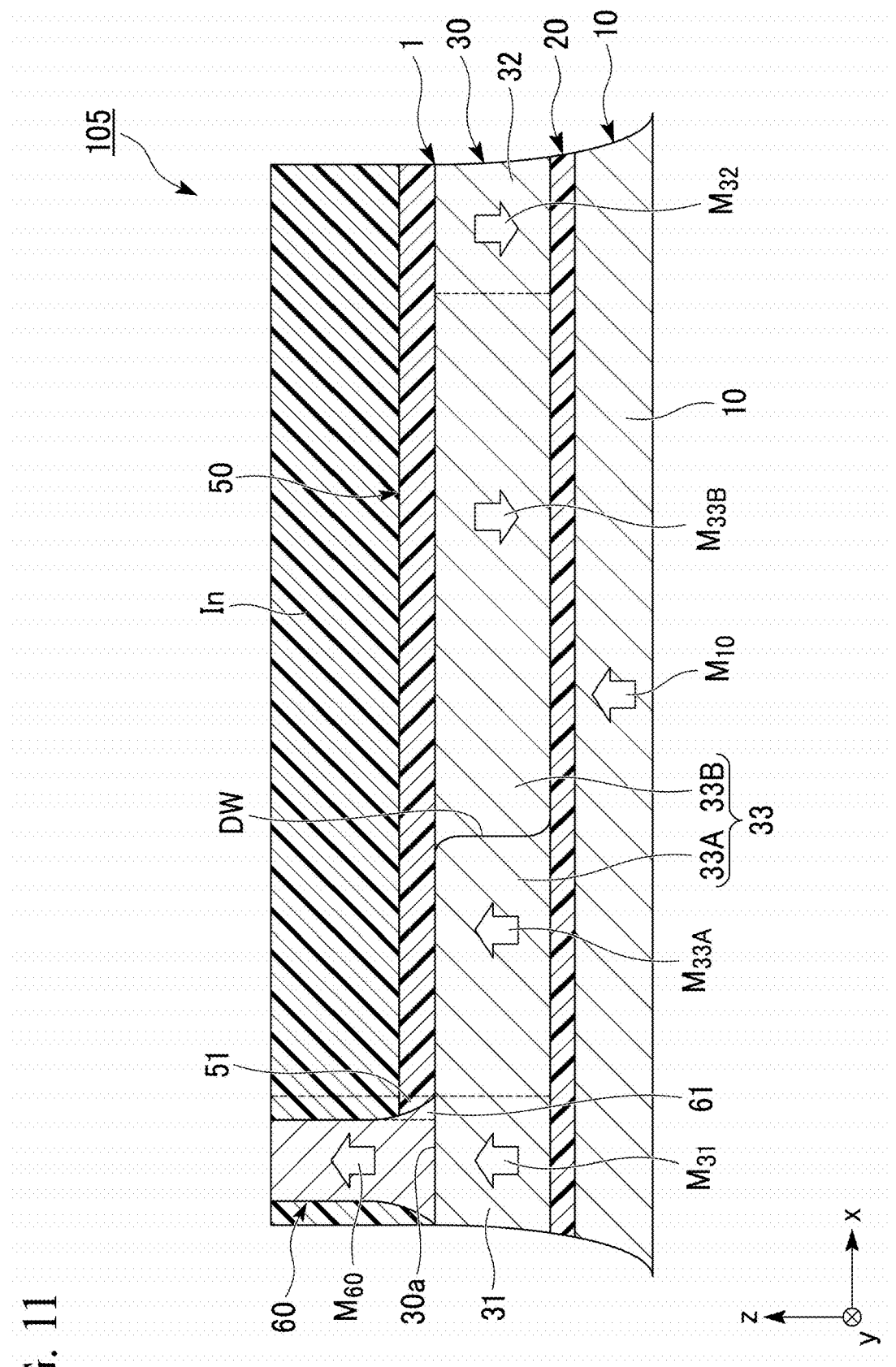
FIG. 11 is a cross-sectional view of a magnetic domain wall movement element according to a fifth modified example.

FIG. 11 is a cross-sectional view of a magnetic domain wall movement element 105 according to a fifth modified example. The magnetic domain wall movement element 105 is different from the magnetic domain wall movement element 100 in that the second conductive layer 70 is not provided. In the magnetic domain wall movement element 105, the same constituent elements as those of the magnetic domain wall movement element 100 are designated by the same reference numerals, and a description thereof will be omitted.

The magnetic domain wall movement element 105 includes only one first conductive layer 60. The magnetization fixing region 32 of the magnetic domain wall movement element 105 is fixed by, for example, an external magnetic field.

Further, the magnetic domain wall movement element 105 may not include the magnetization fixing region 32. In the magnetic domain wall movement element 105 without the magnetization fixing region 32, it is possible to control the operation of the magnetic domain wall DW by controlling the magnitude of the applied current pulse.

Even in the magnetic domain wall movement element 105 according to this embodiment, it is possible to obtain the same effect as that of the magnetic domain wall movement element 100 according to the first embodiment. That is, it is possible to stabilize the operation of the magnetic domain wall DW if at least one conductive layer is provided as in the magnetic domain wall movement element 105.

Additionally, FIG. 11 shows an example in which the magnetic domain wall movement element 105 includes only the first conductive layer 60, but the magnetic domain wall movement element may include only the second conductive layer 70.

While preferred embodiments of the present invention have been described and illustrated above, it should be understood that these are exemplary examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

For example, the featured configurations in the first embodiment and the first to fifth modified examples may be combined.

EXPLANATION OF REFERENCES

1 Laminate
10 Ferromagnetic layer
20 Non-magnetic layer
30 Magnetic domain wall movement layer
30a Upper surface
31, 32 Magnetization fixing region
33 Magnetic domain wall movement region
33A First magnetic domain 33B Second magnetic domain
50 First surface layer
60 First conductive layer
70 Second conductive layer
DW Magnetic domain
In Insulating layer

What is claimed is:

1. A magnetic domain wall movement element comprising:
   a laminate including a ferromagnetic layer, a non-magnetic layer, and a magnetic domain wall movement layer; a first conductive layer and a second conductive layer separated from the first conductive layer in a direction in which the magnetic domain wall movement layer extends; and a first surface layer laminated above a substrate in order from the substrate,
   wherein the non-magnetic layer is sandwiched between the ferromagnetic layer and the magnetic domain wall movement layer,
   wherein the first conductive layer is connected to an upper surface of the magnetic domain wall movement layer,
   wherein the first surface layer contacts at least a part of an upper surface of the magnetic domain wall movement layer,
   wherein the resistivity of the first surface layer is higher than the resistivity of the magnetic domain wall movement layer,
   wherein the first conductive layer and the second conductive layer are in direct contact with the magnetic domain wall movement layer, and
   wherein the first surface layer contacts the upper surface of the magnetic domain wall movement layer in entire region between the first conductive layer and the second conductive layer in a plan view.

2. The magnetic domain wall movement element according to claim 1, further comprising:
   an insulating layer which contacts an upper surface of the first surface layer.

3. The magnetic domain wall movement element according to claim 1,
   wherein the first surface layer contains amorphous or microcrystals.

4. The magnetic domain wall movement element according to claim 1,
   wherein the first surface layer contains at least one element selected from a group consisting of Bi, Ni, Cr, Ti, Zr, and W.

5. The magnetic domain wall movement element according to claim 1,
   wherein the thickness of the first surface layer is 2 nm or less.

6. The magnetic domain wall movement element according to claim 1,
   wherein an easy magnetization direction of the magnetic domain wall movement layer intersects a surface where the magnetic domain wall movement layer spreads.

7. The magnetic domain wall movement element according to claim 1,
   wherein at least a part of the first conductive layer is sandwiched between the first surface layer and the magnetic domain wall movement layer.

8. The magnetic domain wall movement element according to claim 1, further comprising:
   a second surface layer which contacts an upper surface of the first conductive layer,
   wherein the resistivity of the second surface layer is higher than the resistivity of the magnetic domain wall movement layer.

9. The magnetic domain wall movement element according to claim 1, further comprising:
   a third surface layer which contacts a side surface of the first conductive layer,
   wherein the resistivity of the third surface layer is higher than the resistivity of the magnetic domain wall movement layer.

10. A magnetic array comprising:
    a substrate; and
    the magnetic domain wall movement element according to claim 1,
    wherein a plurality of the magnetic domain wall movement elements are integrated on the substrate.

* * * * *